(12) United States Patent
Chang

(10) Patent No.: US 8,564,068 B2
(45) Date of Patent: Oct. 22, 2013

(54) DEVICE AND METHODS FOR SMALL TRENCH PATTERNING

(75) Inventor: Ya Hui Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 13/343,818

(22) Filed: Jan. 5, 2012

(65) Prior Publication Data

US 2013/0175637 A1 Jul. 11, 2013

(51) Int. Cl.
*H01L 27/088* (2006.01)
*H01L 21/70* (2006.01)
*H01L 21/8234* (2006.01)
*H01L 21/3205* (2006.01)
*H01L 21/4763* (2006.01)

(52) U.S. Cl.
USPC 257/383; 438/586; 257/E27.06; 257/E21.627

(58) Field of Classification Search
USPC .......................................... 257/383; 438/586
See application file for complete search history.

(56) References Cited

PUBLICATIONS

Unpublished U.S. Appl. No. 13/460,971, filed May 1, 2012, entitled "Methods for Forming Trenches," 21 pages.
Unpublished U.S. Appl. No. 13/343,771, filed Jan. 5, 2012, entitled "Device and Methods for Forming Partially Self-Aligned Trenches," 19 pages.

*Primary Examiner* — Jarrett Stark
*Assistant Examiner* — Lawrence Tynes, Jr.
(74) *Attorney, Agent, or Firm* — Haynes and Boone, LLP

(57) ABSTRACT

A semiconductor device and methods for small trench patterning are disclosed. The device includes a plurality of gate structures and sidewall spacers, and an etch buffer layer disposed over the sidewall spacers. The etch buffer layer includes an overhang component disposed on the upper portion of the sidewall spacers with an edge that extends laterally. The width between the edges of adjacent overhang components is narrower than the width between adjacent sidewall spacers.

20 Claims, 4 Drawing Sheets

DEVICE AND METHODS FOR SMALL TRENCH PATTERNING

BACKGROUND

As the integrated circuit (IC) fabrication moves to advanced technology nodes, the IC feature size scales down to smaller dimensions. For example, the trench dimensions and gate sizes continue to get smaller and smaller. One limitation to achieving smaller sizes of IC device features is conventional lithography. Small trench formation typically requires a high cost exposure tool, such as extreme ultraviolet (EUV) lithography tools that are constrained by scanner wavelength and various patterns for blocking certain wavelengths. A large etching bias is generally required to compensate for the large lithographic pattern for non-shrinkable critical dimensions, which often results in poor critical dimension uniformity or shorting of the gate when blocking patterns are misaligned. Thus, better methods and materials are needed to define small trench dimensions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
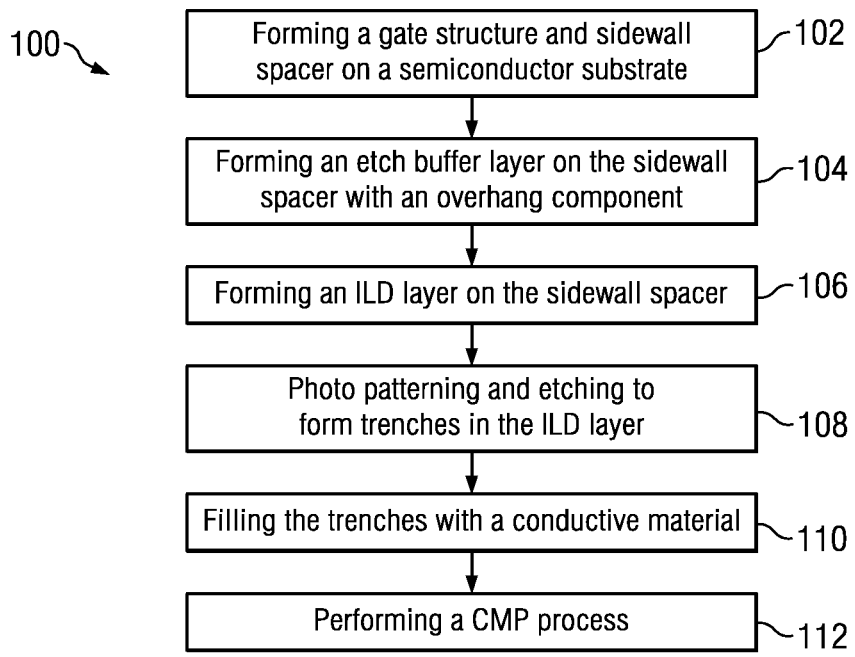
FIG. 1 is a flowchart of a method of making a semiconductor device constructed according to various aspects of the present disclosure in one or more embodiments.

One of the broader forms of the present disclosure involves a semiconductor device with an overhang component. An exemplary semiconductor device includes a semiconductor substrate including a plurality of gate structures and sidewall spacers and an etch buffer layer disposed over the gate structures and sidewall spacers. The etch buffer layer includes an overhang component disposed on the upper portion of the sidewall spacers with an edge that extends laterally from the sidewall spacers The width between the edges of adjacent overhang components is narrower than the width between adjacent sidewall spacers to prevent undesired lateral etching.

Another one of the broader forms of the present disclosure involves a method of making a semiconductor device. The method includes forming a gate structure on a semiconductor substrate, forming a sidewall spacer on the gate structure, forming an etch buffer layer on the sidewall spacer, forming an interlayer dielectric (ILD) layer over the etch buffer layer, defining a trench pattern by photoresist, etching to form trenches in the ILD layer, filling the trenches with a conductive material, and performing a chemical mechanical polishing (CMP) process. The etch buffer layer includes an overhang component disposed on the upper portion of the sidewall spacer with an edge that extends laterally. The width between the edges of adjacent overhang components is narrower than the width between adjacent sidewall spacers. This method advantageously forms trenches with small critical dimensions.

In another embodiment, the method includes forming a gate structure on a semiconductor substrate, forming a sidewall spacer on the gate structure, forming an etch buffer layer on the sidewall spacer by atomic layer deposition or chemical vapor deposition, forming an interlayer dielectric (ILD) layer over the etch buffer layer, etching to form trenches in the ILD layer, filling the trenches with a conductive material, and performing a CMP process. The etch buffer layer includes an overhang component disposed on the upper portion of the sidewall spacer with an edge that extends laterally. The width between the edges of adjacent overhang components is narrower than the width between adjacent sidewall spacers so that the trenches have a width that is narrower than the width between adjacent sidewall spacers.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 for making a semiconductor device constructed according to various aspects of the present disclosure in one or more embodiments. FIGS. 2 through 10 are sectional views of a semiconductor device 200 at various fabrication stages and constructed according to one or more embodiments. The semiconductor device 200 and the method 100 of making the same are collectively described with reference to FIGS. 1 through 10.

The method 100 begins at step 102 by forming a gate structure and a sidewall spacer on a semiconductor substrate 210. Alternatively, the substrate may include germanium, silicon germanium or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

The substrate 210 may also include various doped regions such as p-wells and n-wells (not shown), formed by implantation techniques. As an example, a portion of the substrate 210 is doped p-type and formed a p-well where an n-channel device will be fabricated. Similarly, another portion of the substrate 210 is doped n-type and formed an n-well where a p-channel device will be fabricated. The doped regions are doped with p-type dopants, such as boron or difluoroborane ($BF_2$), and/or n-type dopants, such as phosphorus or arsenic. The doped regions may be formed directly on the substrate 210, in a p-well structure, in an n-well structure, in a dual-well structure, or using a raised structure.

The substrate 210 may further include source and drain (S/D) regions (not shown) formed by a proper technique, such as one or more ion implantations. The S/D regions may further include light doped source/drain (LDD) regions substantially aligned with the gate structure 220 and heavily doped S/D regions (not shown) substantially aligned with associated gate sidewall spacers 230, which are described below.

Typically, after the formation of the S/D regions, one or more annealing processes are performed to activate the S/D regions. The annealing processes include rapid thermal annealing (RTA), laser annealing processes, or other suitable annealing processes. As an example, a high-temperature thermal annealing step may apply temperatures anywhere in the range of 900° C.-1100° C., though other embodiments may use temperatures within a different range. Alternatively, high-temperature annealing may include thermal processes with temperatures above 600° C. This embodiment may further include a "spike" annealing process that has a very short time duration.

Figure 2:
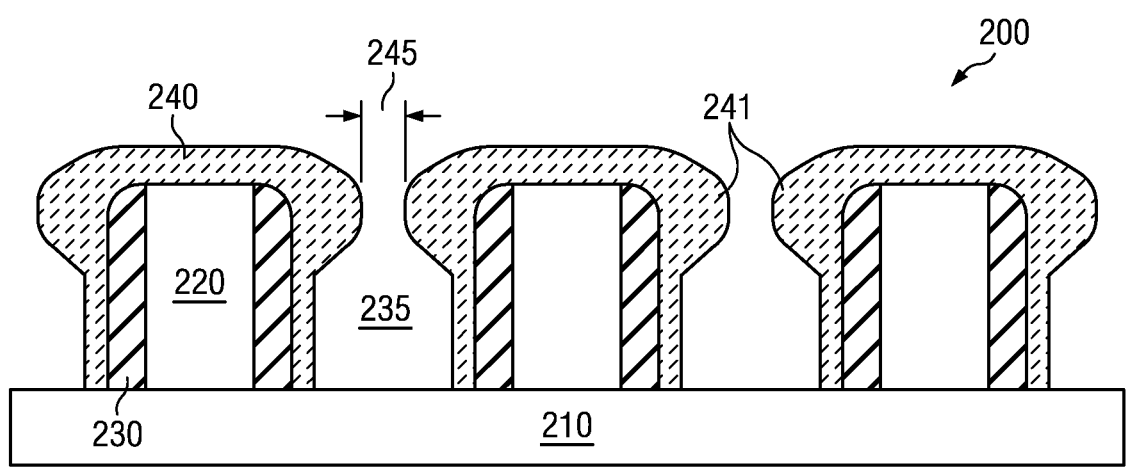
FIGS. 2-10 are sectional views of one embodiment of a semiconductor device at various fabrication stages constructed according to various aspects of the present disclosure in one or more embodiments.
Figure 3:
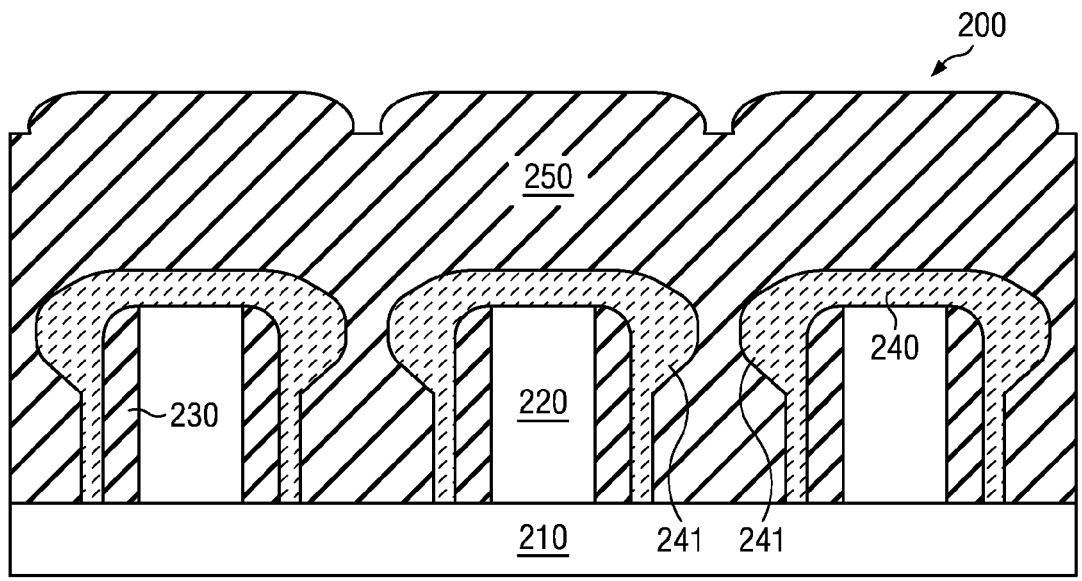

Continuing with FIG. 2, the substrate 210 also includes a gate structure 220 formed by deposition, pattern and etch techniques. The gate structure 220 may include a dummy gate structure. A dummy gate structure refers to a gate structure which will be replaced with a metal gate in subsequent processes. The dummy gate structure may includes a dummy gate layer, such as polysilicon, amorphous silicon or other appropriate materials. The dummy gate layer is deposited over the substrate 210 by deposition techniques. For example, silane ($SiH_4$), di-silane ($Si_2H_6$), or di-chlorosilane ($SiCl_2H_4$) may be used as a chemical gas in a chemical vapor deposition (CVD) process to form a polysilicon layer. Alternatively and additionally, a dummy oxide layer (not shown), such as silicon dioxide ($SiO_2$) or silicon oxynitride (SiON), is disposed over the substrate 210 by thermal oxidation, chemical oxidation, CVD, atomic layer deposition (ALD) or any appropriate method. Thereafter, the dummy gate layer is disposed over the dummy oxide layer. In the depicted embodiment, the gate structure 220 includes a polysilicon dummy gate formed by deposition, patterning and etching processes, in a conventional manner.

Referring to FIG. 2, gate sidewall spacers 230 are formed on the sidewalls of the gate structure 220. The gate sidewall spacers 230 generally include a dielectric material such as silicon nitride ($Si_3N_4$). Alternatively, the gate sidewall spacers 230 may include silicon nitride, silicon oxide, silicon dioxide ($SiO_2$), SiC, oxynitride (SiON), or combinations thereof. Typical formation methods for the gate spacers 230 include depositing a dielectric material over the gate structure 220 and then anisotropically etching back the dielectric material. In the depicted embodiment, the gate sidewall spacers 230 include $Si_3N_4$ formed by CVD deposition and an anisotropic etching as a known art.

At step 104, an etch buffer layer 240 with an overhang component is formed over the upper portion of the sidewall spacer 230. In FIG. 2, the low-etch rate layer includes a shoulder or overhang component 241 that includes an edge that extends laterally from the sidewall spacer 230. The width 245 between adjacent edges 241 is narrower than the width 235 between adjacent sidewall spacers 230. In other words, the width of the etch buffer layer at the upper portion of the sidewall spacer 230 is greater than the width of the etch buffer layer at the lower portion of the sidewall spacer 240. The adjacent edges 241 provide a self alignment of trench patterns for future trench formation. Advantageously, the narrow spacing 245 results in smaller critical dimensions (CD) for the trenches. In one embodiment, the CD of the trenches may be about 2000 angstroms or less in width.

The etch buffer layer 240 may be selected to include a material with high etching resistance that is not intended to be etched or removed. In an exemplary embodiment, the etch buffer layer 240 has a slower etch rate than an interlayer dielectric (ILD) layer 250 (described below). By providing materials with different etch rates, highly selective etching may be achieved to form trenches with smaller CD.

The etch buffer layer 240 may include may include silicon nitrides ($Si_xN_y$) such as $Si_3N_4$, silicon oxide, SiON, SiOC, SiNC, metal oxides, and/or other suitable materials. The etch buffer layer 240 may be formed by atomic layer deposition (ALD), chemical vapor deposition (CVD), plasma-enhanced chemical vapor deposition (PECVD), physical vapor deposition (PVD), and/or other deposition processes known in the art. Pressure and gases applied during the deposition process are controlled to form the overhang component 241. Suitable gases that may be used in the deposition process include silane ($SiH_4$), ammonia ($NH_3$), tetramethylsilane (TMS), or combinations thereof.

In step 106, an ILD layer 250 is formed on the etch buffer layer 240. The ILD layer 250 may be formed by CVD, high density plasma CVD, spin-on methods, sputtering, and/or other suitable methods. The ILD layer 250 typically includes silicon oxide, silicon dioxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the present embodiment, the ILD layer 250 is selected to have a high etch rate compared with the etch buffer layer 240. In the depicted embodiment, the ILD layer 250 includes silicon oxide formed by a CVD technique.

Figure 4:
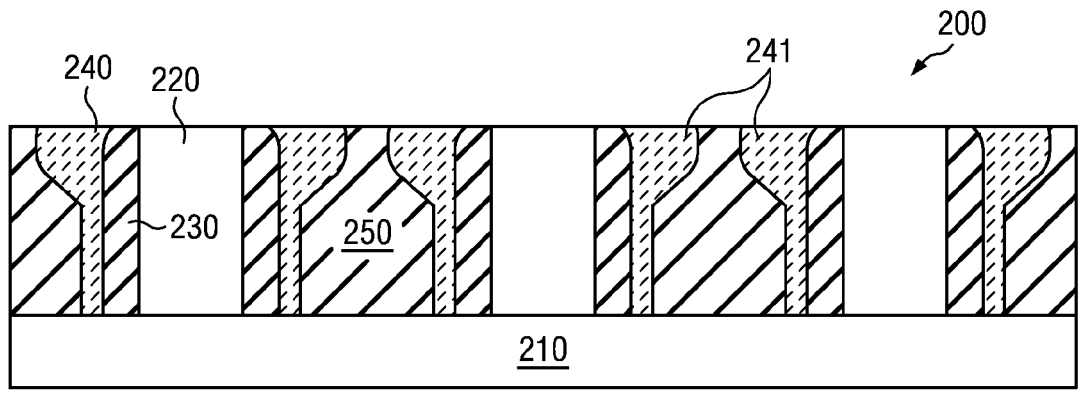
Figure 5:
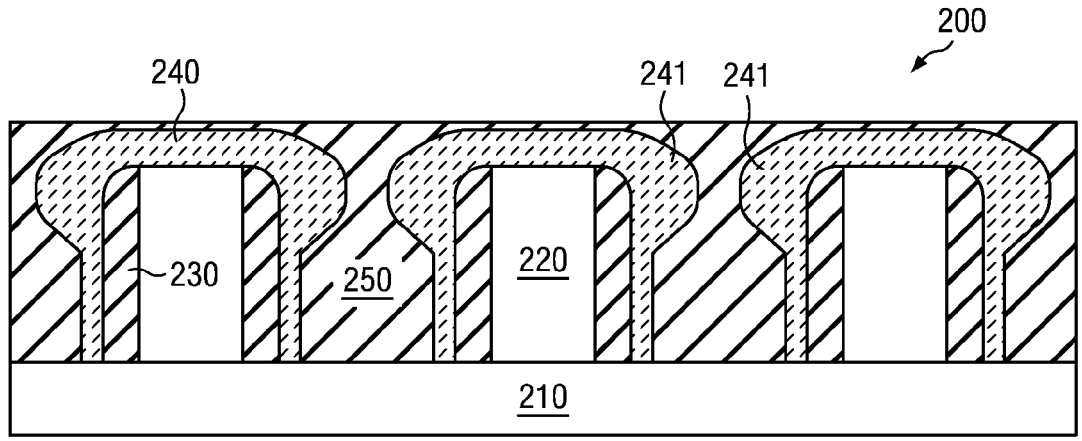
Figure 6:
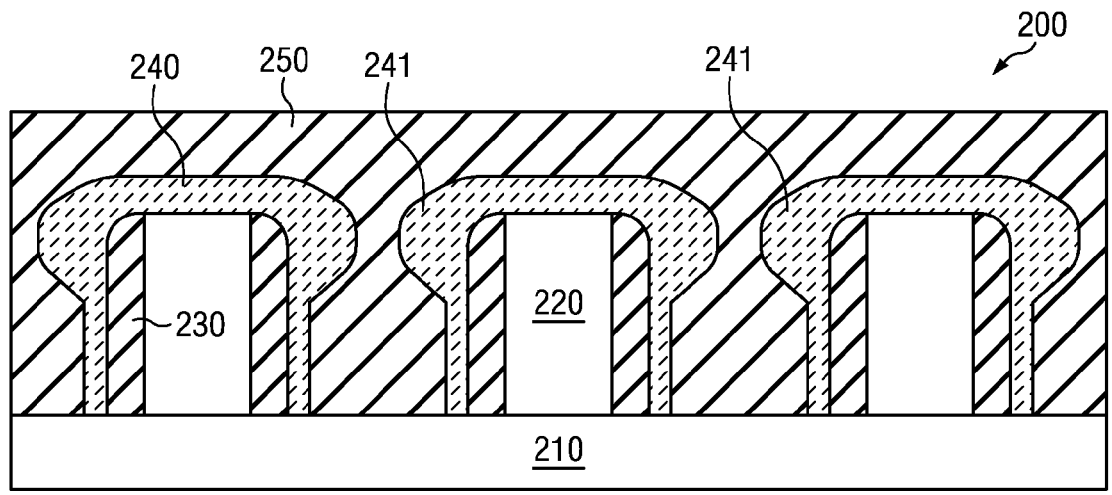

In FIG. 4, a chemical mechanical polishing (CMP) process is performed subsequently to remove excess ILD layer 250 such that, for example, the overhang component 241 is exposed. The CMP process may polish off the top of the etch buffer layer 240 as shown in FIG. 4. Alternatively, the CMP process may stop at the top of the etch buffer layer 240 as shown in FIG. 5, for a better CMP process control. In another embodiment in FIG. 6, ILD layer 250 may be redeposited on the top of the planarized structure in FIG. 5. The CMP process provides a substantially planar surface for the gate structure 220 and the ILD layer 250, as shown in FIGS. 4, 5, and 6.

Figure 7:
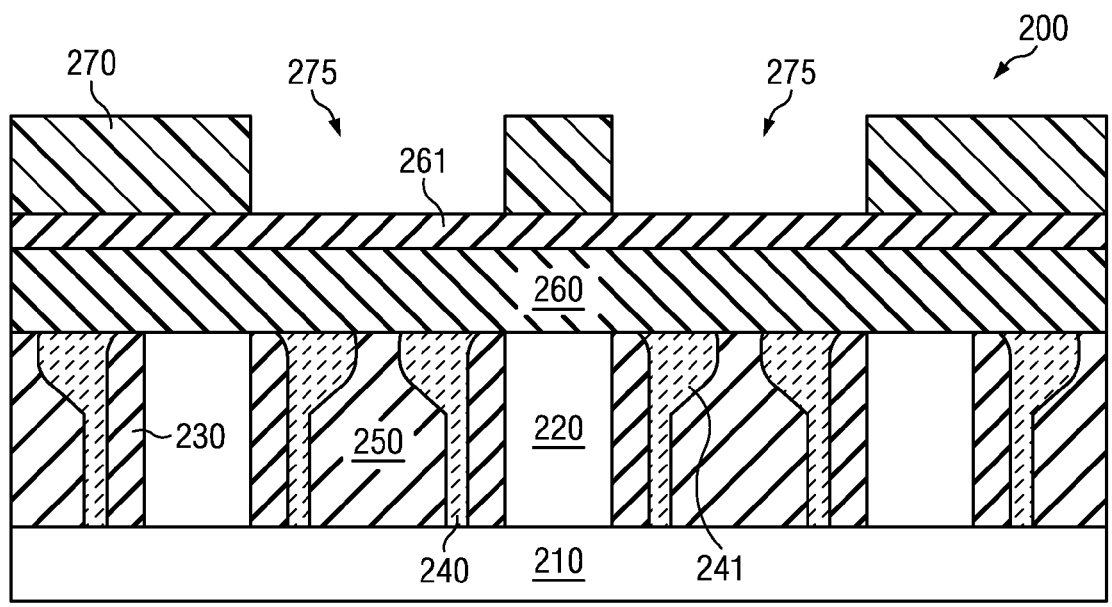

In FIG. 7, a hard mask layer 260, bottom anti-reflection coat (BARC) layer 261, and patterned photoresist layer 270 are used to form trenches. For example, a hard mask layer 260, such as a titanium nitride, is formed and is further patterned to form various openings using a lithography process. Alternatively, the hard mask layer 260 is formed from silicon nitrides ($Si_xN_y$) such as $Si_3N_4$, SiON, SiOC, SiCN, metal oxides, and/or other suitable materials. The openings of the photoresist layer 270 define regions for trenches. In the depicted embodiment, the mask layer includes silicon nitride.

A patterned photoresist layer (or patterned resist layer) 270 is formed on the BARC layer 261. The patterned resist layer 270 includes various openings 275 that define portions for trenches and expose those portions to subsequent etch. In one embodiment, the patterned resist layer 270 is formed by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the resist layer 270 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more openings 275 as illustrated in FIG. 7. The lithography processes described above may only present a subset of processing steps associated with a lithography patterning technique. The lithography process may further include other steps such as cleaning and baking in a proper sequence. For example, the developed resist layer may be further baked, which is referred to as hard baking.

Figure 8:
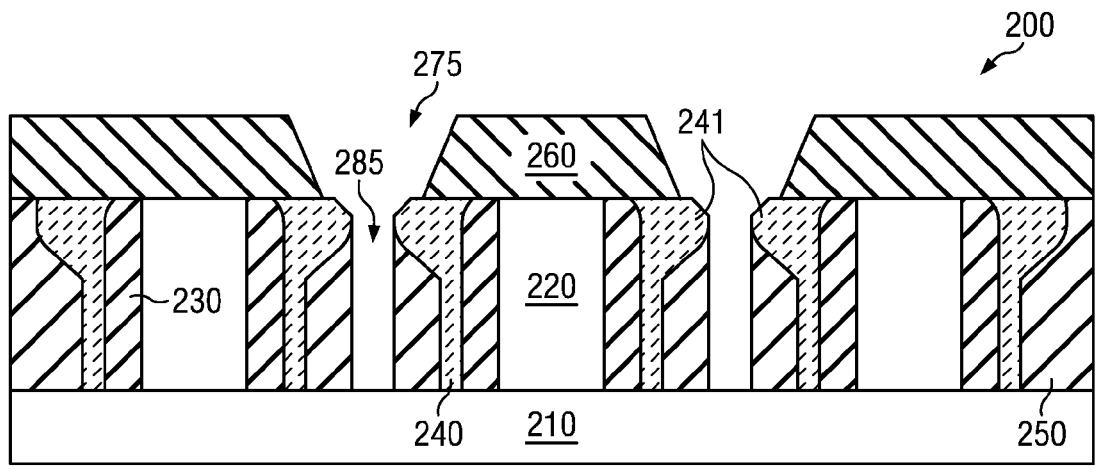

In step 108, the layers are photopatterned and etched to form trenches in the ILD layer 250. As illustrated in FIG. 8, the different layers are etched through the openings 275 of the patterned resist layer 270, resulting in one or more trenches 285. The CD of the trenches 285 is determined by the narrow space between adjacent edges of overhang components 241, rather than the space between adjacent sidewall spacers 230. The trenches 285 are aligned along the edges of adjacent overhang components 241 to ensure that there is sufficient space between gate structures 220. The etching process is applied to etch the ILD layer 250 and to expose the portions of the substrate 210. The different layers are removed by an etch technique such as plasma etching, dry etch, wet etch, or combinations thereof. As can be seen, with a selective etching process, the overhang components 241 may act as a barrier to prevent or significantly slow down lateral etching. With a selective and anisotropic etching process, the overhang components 241 may make trenches that are self-aligned between adjacent overhang components 241 The self-alignment of the trenches 285 ensures that adequate space exists between gate structures 220 to prevent electric shorts. When a misalignment of trench patterning occurs, the overhang components 241 and selective etching process may prevent the misalignment from transferring to the formation of the trenches, which may result in electric shorts. Instead, the overhang components 241 may keep trenches 285 at a proper distance from the gate structure 220. In another words, if there is misalignment of the patterns during photo patterning, etching does not result in shorts in the semiconductor device 200.

With the use of the method 100 and structure 200, a CD limit of a lithography tool can be relaxed and an overlay control window can be wider. A small CD trench and improved overlap accuracy is achieved simultaneously in one simple method. A small CD trench can be achieved with a lithography tool with a larger CD limitation. This results in more efficient processes, smaller etch bias, more manufacturing flexibility, and lower costs. Advantageously, trenches 285 having a CD smaller than what is possible in conventional lithographic techniques may be formed.

In one embodiment, plasma etching is used to form the trenches 285. To ensure selective etching, certain process parameters, such as the main gas and pressure are controlled in a conventional manner. Specifically, fluorine containing gases ($C_xF_y$), such as $CF_4$, $CHF_3$, and $CH_2F_2$ may be used, as well as oxygen, argon, or combinations thereof. A low pressure is also used in the process.

In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the trenches 285. Other dry-etch process may be alternatively used. The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on directional nature of the incident energetic ions to etch in a highly anisotropic manner. After etching, the photoresist layer 270 and BARC layer 261 may be removed by a process such as wet stripping or $O_2$ plasma ashing.

Figure 9:
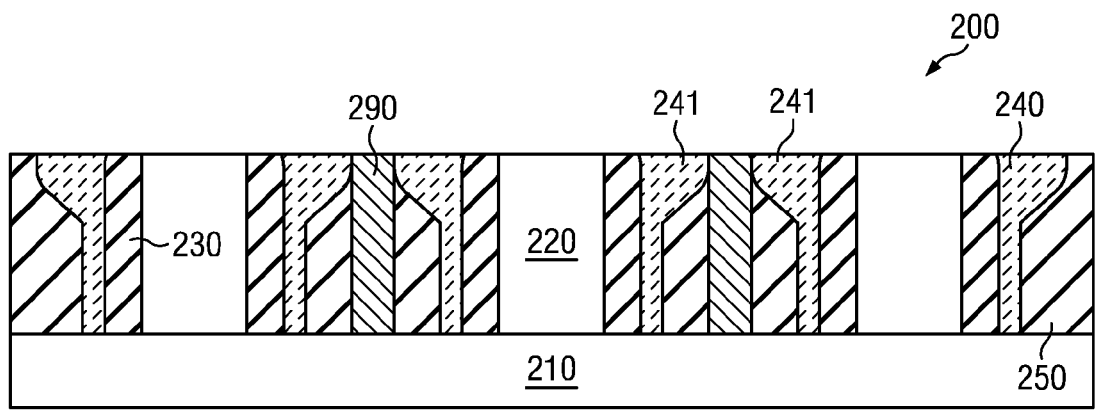

Referring to FIG. 9, the method 100 proceeds to step 110 by filling the trenches 285 with a conductive material, such as one or more metals, resulting in contact features or metal plugs 290. The conductive material substantially fills in the trenches and additionally deposits on the ILD layer 250. In one embodiment, tungsten is used to fill in the trenches 285 to form tungsten plugs. Other metals, such as copper or aluminum, may be used to form metal plugs 290. The metal deposition can use CVD, PVD, plating or a combination thereof.

Still referring to FIG. 9, the method continues to step 112 where another CMP process is performed to remove excessive conductive material formed on the ILD layer 250 and to further planarize the top surface of the ILD layer 250. Accordingly, after the CMP process, the excessive conductive material (e.g., tungsten) on the ILD layer 250 is substantially removed without significant tungsten residue. The mask layer 260 is also removed.

Figure 10:
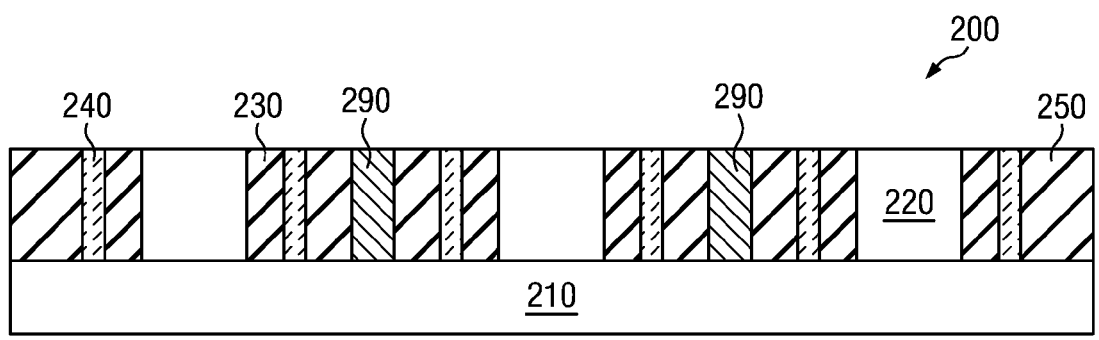

Finally, in FIG. 10, yet another CMP process may be performed if desired.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a semiconductor device, the method comprising:
    forming a gate structure on a semiconductor substrate;
    forming a sidewall spacer on the gate structure;
    forming an etch buffer layer on the sidewall spacer, wherein the etch buffer layer is formed to include an overhang component disposed on an upper portion of the sidewall spacer with an edge that extends laterally, and a width between the edges of adjacent overhang components is narrower than a width between adjacent sidewall spacers;
    forming an interlayer dielectric (ILD) layer over the etch buffer layer;
    etching the ILD layer to form trenches therein, wherein the ILD layer has a higher etch rate than the buffer layer in the etching process;

filling the trenches with a conductive material; and
planarizing the conductive material.

2. The method of claim 1, wherein the trenches have a width that is narrower
than the width between adjacent sidewall spacers.

3. The method of claim 2, wherein the trenches are aligned along the edges of
adjacent overhang components.

4. The method of claim 1, wherein the etch buffer layer is formed by atomic
vapor deposition.

5. The method of claim 4, wherein pressure is controlled to form the overhang
component.

6. The method of claim 1 wherein the trenches are formed by plasma etching.

7. The method of claim 6, wherein gas and pressure are controlled to achieve a selective trench etching process.

8. The method of claim 1, wherein the conductive material is tungsten.

9. The method of claim 1, wherein the ILD layer comprises silicon oxide and the
etch buffer layer comprises silicon nitride.

10. The method of claim 1, wherein the planarization is a chemical mechanical planarization (CMP) process, which is performed after the ILD layer is formed over the etch buffer layer, after the trenches are filled with a conductive material, or both.

11. A method of forming a semiconductor device, the method comprising:
forming a gate structure on a semiconductor substrate;
forming a sidewall spacer on the gate structure;
forming an etch buffer layer on the sidewall spacer by atomic layer deposition or chemical vapor deposition, wherein the etch buffer layer comprises an overhang component disposed on an upper portion of the sidewall spacer with an edge that extends laterally, and wherein a width between the edges of adjacent overhang components is narrower than a width between adjacent sidewall spacers;
forming an interlayer dielectric (ILD) layer over the etch buffer layer;
etching the ILD layer to form trenches therein, wherein the ILD layer has a higher etch rate than the buffer layer in the etching process;
filling the trenches with a conductive material; and
performing a chemical mechanical polishing (CMP) process.

12. The method of claim 11, wherein the trenches have a width that is narrower than the width between adjacent sidewall spacers.

13. The method of claim 11, wherein the trenches are aligned along the edges of adjacent overhang components.

14. The method of claim 11, wherein pressure is controlled to form the overhang component.

15. A semiconductor device, comprising:
a semiconductor substrate;
a plurality of gate structures over the semiconductor substrate;
a plurality of sidewall spacers on the gate structures; and
an etch buffer layer disposed over the sidewall spacers,
wherein the etch buffer layer comprises an overhang component disposed on an upper portion of the sidewall spacers with an edge that extends laterally, and
herein a width between the edges of adjacent overhang components is narrower than a width between adjacent sidewall spacers.

16. The semiconductor device of claim 15, further comprising a trench between adjacent sidewall spacers, wherein the trench has a width that is narrower than the width between adjacent sidewall spacers.

17. The semiconductor device of claim 16, wherein the trench is aligned along the edges of adjacent overhang components.

18. The semiconductor device of claim 15, wherein the etch buffer layer comprises silicon nitride.

19. The semiconductor device of claim 15, wherein the sidewall spacers comprise silicon nitride.

20. The semiconductor device of claim 15, wherein the etch buffer layer has a slower etch rate than the ILD layer.

* * * * *